United States Patent [19]
Hazeyama et al.

[11] Patent Number: 5,714,112
[45] Date of Patent: Feb. 3, 1998

[54] PROCESS FOR PRODUCING A SILICA SINTERED PRODUCT FOR A MULTI-LAYER WIRING SUBSTRATE

[75] Inventors: Ichiro Hazeyama; Kazuhiro Ikuina; Mitsuru Kimura, all of Tokyo, Japan

[73] Assignee: NEC Corporation, Tokyo, Japan

[21] Appl. No.: 567,467

[22] Filed: Dec. 5, 1995

Related U.S. Application Data

[62] Division of Ser. No. 439,798, May 12, 1995.

[30] Foreign Application Priority Data

| May 13, 1994 | [JP] | Japan | 6-099818 |
| Oct. 13, 1994 | [JP] | Japan | 6-247929 |
| Apr. 11, 1995 | [JP] | Japan | 7-085129 |

[51] Int. Cl.$^6$ .................... C04B 35/64; C04B 35/14
[52] U.S. Cl. .................... 264/675; 264/650; 264/681; 501/154
[58] Field of Search .................... 156/89; 264/56, 264/61, 63, 65, 650, 669, 670, 675, 681; 501/154

[56] References Cited

U.S. PATENT DOCUMENTS

| 4,234,367 | 11/1980 | Herron et al. | 264/61 X |
| 4,297,309 | 10/1981 | North | 264/56 |
| 4,336,048 | 6/1982 | Van der Steen | 65/18.4 |
| 4,457,972 | 7/1984 | Griffith | 428/334 |
| 4,504,339 | 3/1985 | Kamehara et al. | 264/61 X |
| 4,547,625 | 10/1985 | Tosaki | 174/68.5 |
| 4,608,316 | 8/1986 | Toda et al. | 264/61 X |
| 4,747,863 | 5/1988 | Clasen et al. | 264/56 X |
| 5,071,793 | 12/1991 | Jean | 501/16 |
| 5,082,606 | 1/1992 | Rotman et al. | 264/61 X |
| 5,230,846 | 7/1993 | Tamhankar et al. | 264/61 |
| 5,288,558 | 2/1994 | Nöthe | 428/426 |
| 5,302,219 | 4/1994 | Hargis | 264/61 X |
| 5,393,604 | 2/1995 | Sanchez | 264/63 X |

FOREIGN PATENT DOCUMENTS

| 61-247660 | 11/1986 | Japan. |
| 2-26862 | 1/1990 | Japan. |
| 2-302362 | 12/1990 | Japan. |

*Primary Examiner*—Curtis Mayes
*Attorney, Agent, or Firm*—Sughrue,Mion,Zinn, Macpeak & Seas, PLLC

[57] ABSTRACT

A process for producing a silica sintered product for a multi-layer wiring substrate of the invention includes: providing a fine silica powder having an average particle size of 5 to 500 nm and a fine crystallized quartz powder having an average particle size 1 to 10 μm, the fine crystallized quartz powder having a volume equal to 1 to 20% of the entire volume of the fine silica powder and the fine crystallized quartz powder; mixing the fine silica powder and the fine crystallized quartz powder with a binder and a solvent to form a silica-containing slurry; forming a green sheet by slip-casting the silica-containing slurry; and firing the green sheet at a temperature of 800° to 1200° C. in an atmosphere containing steam at a partial pressure of 0.005 to 0.85 atm.

4 Claims, 3 Drawing Sheets

PROCESS FOR PRODUCING A SILICA SINTERED PRODUCT FOR A MULTI-LAYER WIRING SUBSTRATE

This is a divisional of U.S. patent application Ser. No. 08/439,798, filed May 12, 1995.

BACKGROUND OF THE INVENTION

The present invention relates to a ceramic multi-layer wiring substrate for a microwave integrated circuit required to have a low dielectric constant and a low dielectric loss factor, and to a process for producing the same, as well as a silica sintered product used therefor.

Conventionally, the ceramic multi-layer substrate has been widely used in a field requiring a high speed transmission, because a fine circuit pattern can be easily mounted on the ceramic multi-layer substrate, so that a plurality of elements can be mounted at a high density on the board and thus, the length of a wiring can be shortened. However, to provide a further high speed transmission, an attempt to reduce the dielectric constant of the substrate material used has been advanced, because the signal propagation delay time is proportional to a square root of the dielectric constant of an insulating material around the wiring. For example, a large number of already well-known alumina substrates having a dielectric constant reduced by compounding of glass and alumina materials have been put into practical use as the ceramic multi-layer substrate (e.g., a glass/ceramics multi-layer substrate). In addition to these substrates, a substrate made of a composite material comprising borosilicate glass and quartz and a substrate made of a composite material having a dielectric constant set at 4 to 5 and comprising borosilicate glass and cordierite have been also put into practical use.

On the other hand, for example, in a field of microwave integrated circuits, it is required to suppress an increase in dielectric loss in a high frequency band to reduce a transmission loss, in addition to the reducing of the dielectric constant. Not only in the borosilicate glass multi-layer substrate, but also in the glass/ceramic multi-layer substrate, the dielectric constant is at least on the order of 3.9, which cannot sufficiently meet the requirement for reducing the dielectric loss of the multi-layer substrate.

The insulating materials satisfying both a low dielectric constant and a low dielectric loss factor include silica. It has been reported that silica has a relative dielectric constant of 3.8 and a Qf product of 15,000 (GHz). It is also desired in the ceramic multi-layer substrate that a metal having a low resistance is used for a wiring material from the viewpoint of transmitting characteristic. However, the temperature for sintering the silica is very high, as compared with the melting points of metals such as gold, silver, copper and the like which are known as low-resistance metals, and it is difficult to form a multi-layer wiring or interconnection by co-fired silica.

Thereupon, because of the high temperature for sintering the silica, when silica is utilized for the multi-layer substrate, it is required to add a plurality of materials such as $B_2O_3$ and borosilicate glass in an amount of about 10 to 20% by weight to form a glass phase, thereby lowering the sintering temperature.

For a method for lowering the sintering temperature by an additive, a technique for adding 5% or more by weight of $BPO_4$ to provide the sintering temperature of 950° to 1,100° C. is disclosed in Japanese Patent Application Laid-open No. 302362/90. In the sintering at a temperature of 1,000° C. or lower which is required when copper or silver is used as a conductor, the additive is in an amount of 20% or more. As one example of a process for producing a silica sintered product at a low temperature, a technique for producing a silica sintered product by subjecting a ultrafine powder of silica having an average particle size of 50 nm or less, preferably in a range of 5 to 20 nm to a hot pressing at a temperature of 500° to 800° C. is disclosed in Japanese Patent Application Laid-open No. 26862/90. It is also described in this Japanese patent that a rare earth metal oxide may be added in an amount of about 5% to the ultrafine powder if necessary. However, the application of a high pressure during firing is not desirable for the process for producing a multi-layer substrate.

SUMMARY OF THE INVENTION

It is an object of the present invention to provide a multi-layer wiring substrate having both of a low dielectric constant and a low dielectric loss factor, and a process for producing the same.

To achieve the above object, according to an aspect and feature of the present invention, there is provided a multi-layer wiring substrate, comprising an insulating layer which is essentially formed of a silica sintered product, and a conductor layer formed on an upper surface of the insulating layer from a electrically conductive material having a melting point essentially fallen in a range of 800° to 1,200° C.

A process for producing a silica sintered product for a multi-layer wiring substrate of the invention includes: providing a fine silica powder having an average particle size of 5 to 500 nm and a fine crystallized quartz powder having an average particle size 1 to 10 μm, the fine crystallized quartz powder having a volume equal to 1 to 20% of the entire volume of the fine silica powder and the fine crystallized quartz powder; mixing the fine silica powder and the fine crystallized quartz powder with a binder and a solvent to form a silica-containing slurry; forming a green sheet by slip-casting the silica-containing slurry; and firing the green sheet at a temperature of 800° to 1200° C. in an atmosphere containing steam at a partial pressure of 0.005 to 0.85 atm.

In the multi-layer wiring substrate according to the present invention, the insulating layer may comprise 95.0 to 99.5% by weight of $SiO_2$, 0.5 to 5.0% by weight of an alkali metal, 0.5 to 5.0% by weight of an alkaline earth metal, and the balance of oxygen or hydroxyl group, or the insulating layer may comprise 95.0 to 99.0% by weight of $SiO_2$, 1.0 to 5.0% by weight of $B_2O_3$. A low resistance conductor such as Au, Ag, Cu or Ag—Pd having a melting point in a range of 800° to 1,200° C. may be included as a conductor layer on the insulating layer.

The silica sintered product in the multi-layer substrate can be produced by preparing a starting powder of $SiO_2$ having an average particle size of 5 to 500 nm, adding 0.5 to 5% by weight of an alkali metal compound or an alkaline earth metal compound or 1.0 to 5.0% by weight of $B_2O_3$ to the starting powder, and firing the resulting mixture at a temperature in a range of 800° to 1,200° C. in an atmosphere containing steam at a steam partial pressure in a range of 0.005 to 0.85 atm.

Alternatively, the silica sintered product may be produced by mixing a fine powder of silica having an average particle size of 5 to 500 nm with a binder and a solvent to form a silica-containing slurry, slip-casting the silica-containing slurry to form a green sheet, and firing the green sheet at a temperature in a range of 800° to 1,200° C. in an atmosphere containing steam at a steam partial pressure in a range of 0.005 to 0.85 atm.

When the silica sintered product is used for a multi-layer substrate, a green sheet may be fabricated using a slurry produced from a fine powder of silica having an average particle size of 5 to 500 nm, a binder and a solvent, and a conductor layer may be formed and laminated on the green sheet. Then, the laminate of the green sheet and the conductor layer may be integrally fired at a temperature in a range of 800° to 1,200° C. in an atmosphere containing steam at a steam partial pressure in a range of 0.005 to 0.85 atm. Alternatively, a conductor layer may be formed and laminated on the silica sintered product, and the laminate may be integrally pressed under heating.

It is desirable that at least a conducting material selected from the group consisting of Au, Ag, Ag—Pd and Cu is used in the multi-layer substrate. This is because these metals have a good high frequency characteristic. The silica sintered product may be crystalline or amorphous, but it is desirable from the viewpoints of thermal expansion coefficient and transition temperature that 50% by weight or more of the entire silica sintered product is an amorphous silica.

In the production of the silica sintered product according to the present invention, it is important that the average particle size of the fine powder of silica is in a range of 5 to 500 nm, and that the firing is carried out at a temperature in a range of 800° to 1,200° C. in an atmosphere containing steam at a steam partial pressure in a range of 0.005 to 0.85 atm.

For the fine powder of silica, it is difficult to produce a fine powder of silica having an average particle size smaller than 5 nm, and if the average particle size is larger than 500 nm, it is difficult to carry out the sintering at a temperature equal to or lower than 1,200° C. For this reason, the average particle size of the fine silica powder is in a range of 5 to 500 nm, preferably in a range of 5 to 50 nm.

If the partial pressure of steam in the firing atmosphere is lower than 0.005 atm., it is difficult to perform the sintering and therefore, the partial pressure of steam is higher than 0.005 atm. As the amount of steam is larger, the sinterability of silica is enhanced. However, it is difficult to create an atmosphere containing steam at a partial pressure of steam exceeding 0.85 atm. Therefore, the partial pressure of steam is in a range of 0.005 atm (inclusive) to 0.85 atm (inclusive), and the preferred partial pressure of steam during firing is between 0.3 to 0.7 atm. If these conditions are satisfied, it is possible to perform the sintered of silica in a controllable manner at a temperature in a range of 800° to 1,200° C.

If 50% by weight or more of the fine powder of silica is the amorphous silica, it is desirable, because the influence to a variation in weight at a transition point can be reduced. In this case, if particles of the amorphous silica powder are spherical, it is preferable, because the sinterability is improved. It is desirable that the specific surface area is in a range 5 to 450 m².

When there is used mixed powder consisting of dust-size particles of silica of 5–500 nm and 1–20 volume % of crystallized quartz powder having a mean particle diameter of 1–10 μm, a sintered body of silica can be improved in mechanical strength and toughness. It is preferable that the crystallized quartz consists of at least one of α-quartz, cristobalite and tridymite. It is not preferable that, if the mean particle diameter is less than 1 μm, then the toughness is not improved, and, if the mean particle diameter is more than 20 μm, then the degree of sintering is deteriorated. As for the loading, if the load is less than 1 volume %, then the toughness is not improved, and, if the load is more than 20 volume %, then the degree of sintering is deteriorated.

In producing a multi-layer wiring substrate, it is most preferable that a conductor layer is integrally formed on a green sheet and then, resulting laminate is calcined. This is because the procedure for producing the multi-layer substrate can be simplified. However, the conductor layer may be integrally formed on the previously sintered silica.

According to the present invention, the advancement of sintering of silica particles can be promoted by adding an alkali metal, an alkaline earth metal and $B_2O_3$. Even if no additive is added, it is possible to sinter the silica particles by prolonging the firing time. However, the time required for the sintering can be shortened by adding appropriate amounts of the additives. If the amounts of alkali metal compound and alkaline earth metal compound added are less than 0.5% by weight, an effect is not observed. If the amount of $B_2O_3$ added is less than 1% by weight, an effect is not observed. As the added amount is larger, the effect is increased. However, the addition of the additive in an amount of 5% by weight or more results in an increase in dielectric constant. Therefore, it is preferable that the amounts of alkali metal and alkaline earth metal added are in a range of 0.5 to 5% by weight, and the amount of $B_2O_3$ added is in a range of 1 to 5.0% by weight. It is desirable that the further preferred amount of additive added is in a range of 3 to 5% by weight for any of alkali metal, alkaline earth metal and $B_2O_3$. The alkali and alkaline earth metal compounds which may be used for the addition of alkali and alkaline earth metals include carbonates, oxides, hydroxides, fluorides and the like. Although the method for mixing these compounds with a silica powder is particularly not limited, it is desirable that weighed powder is dispersed into a solution, and a uniform mixing is carried out, so that metal compounds are dissolved, as shown in a flow chart in FIG. 1a. A silica powder may be added and mixed into a solution containing only metal salts dissolved therein, so that the silica powder particles may be coated. After mixing, the powder can be mixed uniformly by removing the solvent by drying. Therefore, it is desirable to use a metal compound which has a higher solubility to a solvent.

In producing a multi-layer wiring substrate, a green sheet having a conductor layer formed thereon is fabricated, and a plurality of the green sheets are laminated one on another. The resulting laminate is integrally fired. In this manner, a multi-layer substrate can be produced. Alternatively, the multi-layer substrate may be produced by integrally forming a conductor layer on the previously sintered silica product.

In this way, according to the present invention, it is possible to provide a multi-layer wiring substrate having a very low dielectric constant. Particularly for an amorphous silica sintered product, the dielectric constant thereof is in a range of 3.5 to 4.0, and the signal propagation delay time can be shortened. In addition, it is possible to achieve the sintering at a temperature lower than the melting point of a metal conductor such as Au, Ag and the like or an alloy conductor such as Ag—Pd and therefore, it is possible to form a multi-layer wiring substrate having a conductor mounted by the simultaneous calcination.

Particularly, when α-quartz powder and the like are added, the fracture toughness value was that Klc=3.5–3.6 $(MPa/m^{1/2})$, whereby the sintered material of silica having the satisfactory reliability could be obtained.

DETAILED DESCRIPTION OF THE PREFERRED EMBODIMENTS

The present invention will now be described by way of preferred embodiments in connection with the accompanying drawings. The present invention is not limited to following examples.

EXAMPLE 1

A powder of amorphous silica having an average particle size of 5 nm was used as a starting powder. A predetermined amount of the starting powder was uniformly mixed with a solution of butyral dissolved in a solvent consisting essentially of ethanol to produce a slurry having a viscosity of 3,000 to 10,000 cps. The slurry was subjected to a slip casting process to form a green sheet having a thickness of 50 µm to 200 µm. The green sheet was subjected to a hot pressing to form a green laminate. The laminate was fired at 800° C. for 24 hours in an atmosphere containing steam at a partial pressure of 0.5 atm as well as oxygen and nitrogen (Sample No. 1 in Table 1).

TABLE 1

| | P.S. nm | Cal. tem. °C. | Time H | Cal. atmosphere | P.P.S. atm | Note |
|---|---|---|---|---|---|---|
| 1 | 5 | 800 | 24 | steam, air | 0.5 | Example 1 |
| 2 | 7 | 900 | 10 | steam, air | 0.5 | Sintered |
| 3 | 7 | 900 | 24 | steam, nitrogen | 0.5 | Sintered |
| 4 | 12 | 1000 | 10 | steam, air | 0.5 | Sintered |
| 5 | 12 | 1000 | 24 | steam, nitrogen | 0.5 | Sintered |
| 6 | 40 | 1100 | 10 | steam, air | 0.5 | Sintered |
| 7 | 40 | 1100 | 24 | steam, nitrogen | 0.5 | Sintered |
| 8 | 7 | 1200 | 48 | air | — | Unsintered |

P.S. = Particle size
Cal. tem. = Calcining temperature
Cal. atmosphere = Calcining atmosphere
P.P.S. = Partial pressure of steam The silica sintered product produced in this manner was white in color and had a light transmission property and a density of 2.20 g/cm³. The identification of the crystal phase by an X-ray diffraction process showed that the silica sintered product was amorphous (see FIG. 3). As a result of the observation of a broken face of the sample by a scan-type electronic microscope, some voids equal to or less than 1 µm were observed, but it was confirmed that the sample was a dense sintered product. The measurement of the dielectric constant of the sintered product showed ∈r=3.8 at 1 MHz.

EXAMPLE 2

A coarse powder of amorphous silica was finely pulverized by a dry pulverizer to form a fine powder. The particle size of this powder was measure by a laser diffraction granulometer to provide an average particle size of 0.5 µm. Using this fine powder as a starting powder, a green laminate was produced through steps similar to those in Example 1. The green laminate was fired at 1,200° C. for 48 hours in an atmosphere containing steam at a partial pressure of 0.85 atm as well as oxygen and nitrogen (sample No. 12 in Table 2).

TABLE 2

| | P.S. nm | Cal. tem. °C. | Time H | Cal. atmosphere | P.P.S. atm | Note |
|---|---|---|---|---|---|---|
| 9 | 5 | 1200 | 48 | steam, air | 0.004 | Com.Ex.2 |
| 10 | 7 | 1200 | 48 | steam, air | 0.005 | Ex.3 |
| 11 | 40 | 1200 | 48 | steam, air | 0.20 | Sintered |
| 12 | 500 | 1200 | 48 | steam, air | 0.85 | Ex.2 |
| 13 | 5 | 750 | 48 | steam, air | 0.85 | Com.Ex.1 |

Figure 4:
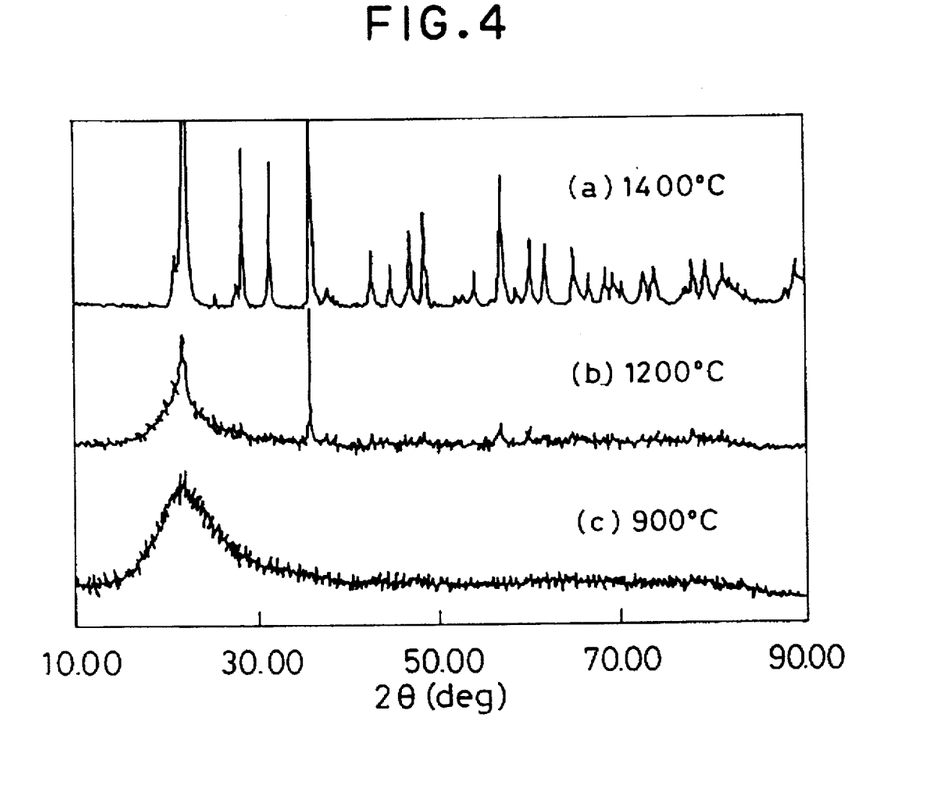
FIG. 4 is an XRD pattern showing a crystal phase provided when the calcination was carried out at temperatures of 900° C., 1,200°0 C. and 1,400° C.

P.S. = Particle size
Cal. tem. = Calcining temperature
Cal. atmosphere = Calcining atmosphere
P.P.S. = Partial pressure of steam
Com.Ex. = Comparative example
Ex. = Example The silica sintered product made in this manner was white in color and has a light transmission property and a density of 2.20 g/cm³, as did the sample made in the Example 1. The identification of the crystal phase by an X-ray diffraction process showed that some cristobalite phases were contained, but the most portion was amorphous (see FIG. 4). As a result of the measurement of the dielectric constant of the sintered product, ∈r=3.9 at 1 MHz.

EXAMPLE 3

Using an amorphous silica powder having an average particle size of 7 nm, a green laminate was fabricated through steps similar to those in Example 1, and then fired at 1,200° C. for 48 hours. In this case, steam at a partial pressure Of 0.005 atm, oxygen and nitrogen were used as atmospheric components (sample No. 10 and Table 2).

The produced sample had a sintered product density of 2.20 g/cm³, as in Examples 1 and 2, and was white in appearance and had a light transmission property. As a result of the identification of the crystal phase by an X-ray diffraction process, it was confirmed that some cristobalite phases were contained, as in Example 2, and the remaining portion was amorphous.

EXAMPLE 4

A powder mixture of 50% by weight of an amorphous silica powder having an average particle size 7 nm similar to the above-described powder and a crystalline quartz powder having an average particle size 1 µm was dispersed into ethanol using a homogenizer to provide a dispersion. A solution of polyvinyl butyral dissolved in a solvent consisting essentially of ethanol was mixed with a predetermined amount of the dispersion to produce a slurry having a viscosity adjusted to 3000 to 10,000 cps. The mixture was subjected to a slip casting process to form a green sheet having a thickness of 50 to 200 µm. The green sheet was subjected to a hot pressing to provide a green laminate. The green laminate was fired at 1,200° C. for 24 hours in an atmosphere containing steam at a partial pressure of 0.5 atm, oxygen and nitrogen (sample No. 16 in Table 3).

TABLE 3

Example of sintering (3)

| | Composition | Cal. tem. °C. | Time Hr | P.P.S. atm | Note |
|---|---|---|---|---|---|
| 14 | Cry. quartz (5 nm) 45 wt % | 1,200 | 24 | 0.5 | Com.Ex.4 |
| 15 | Amo. silica (7 nm) 45 wt % Cry. quartz (1 μm) 55 wt % | 1,200 | 24 | 0.5 | Com.Ex.3 |
| 16 | Amo. silica (7 nm) 50 wt % Cry. quartz (1 μm) 50 wt % | 1,200 | 24 | 0.5 | Ex.4 |
| 17 | Amo. silica (7 nm) 80 wt % Cry. quartz (1 μm) 20 wt % | 1,200 | 24 | 0.5 | Ex.5 |
| 18 | Amo. silica (12 nm) 80 wt % Cry. quartz (0.5 μm) 20 wt % | 1,200 | 24 | 0.5 | Sintered |

Cal. tem. = Calcining temperature
P.P.S. = Partial pressure of steam
Com.Ex. = Comparative example
Ex = Example
Cry. = crystalline
Amo. = Amorphous The sample produced in this manner was while in color and had a light transmitting property; as did the sintered product made of the amorphous silica alone, and had a density of 2.35 g/cm$^3$. As a result of the identification of the crystal phase by an X-ray diffraction process, the quartz was observed, and some cristobalite phases and amorphous phases were observed.

EXAMPLE 5

Using a powder mixture of 80% by weight of an amorphous silica powder having an average particle size of 7 nm and 20% by weight of crystalline quartz having an average particle size of 1 μm, a green laminate was fabricated and calcined through steps similar to those in Example 4 (sample No. 17 in Table 3). The sample produced in this manner was while in color and had a light transmitting property, as did the sintered product made of the amorphous silica alone, and had a density of 2.22 g/cm$^3$. As a result of the identification of the crystal phase by an X-ray diffraction process, a broad pattern indicating the amorphous phase and a peak indicative of the quartz were observed.

EXAMPLE 6

Using a powder mixture of 95% by weight of an amorphous silica powder having an average particle size of 7 nm and 5% by weight of a borosilicate glass powder having an average particle size of 1 μm and a powder mixture of 97% by weight of an amorphous silica powder having an average particle size of 7 nm and 3% by weight of a borosilicate glass powder having an average particle size of 1 μm, a green laminate was fabricated through steps similar to those in Example 4. The green laminate was fired at 1,000° C. for 24 hours in an atmosphere comprising steam at a partial pressure of 0.5 atm, nitrogen and oxygen. The produced samples had an appearance similar to that of the sample produced in Example 1, and had densities of 2.19 g/cm$^3$ and 2.20 g/cm$^3$, respectively. The borosilicate glass had a dielectric constant of 5.0, and the sintered products had dielectric constants of 4.0 and 3.9, respectively.

EXAMPLE 7

Figure 2:
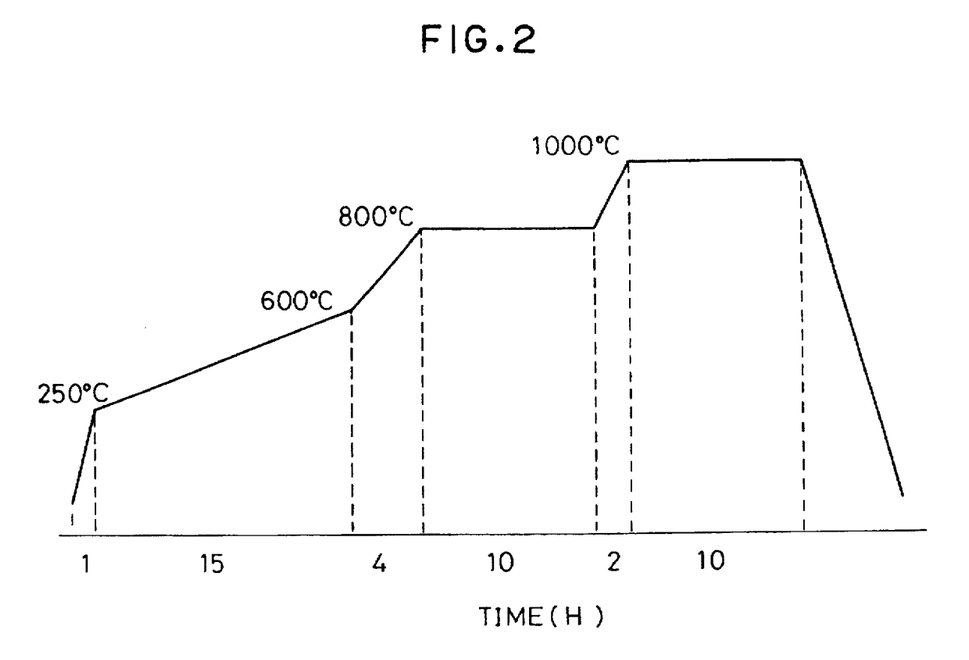
FIG. 2 is a graph illustrating sintering conditions in the embodiment of the present invention.

Using the above-described amorphous silica powder having an average particle size of 7 nm as a starting powder, a green sheet having a thickness of 100 μm was fabricated in the same manner as in example 1. Vis holes having a diameter 200 μm were made in the green sheet, and a Cu paste was embedded in the via holes. Twenty sheets each having a conductor pattern printed therein with the Cu paste were laminated one on another and subjected to a hydrostatic pressing at 90° C. for 30 minutes under 50 MPa to form a green laminate. This laminate was subjected to a binder-removing and firing treatment under conditions shown in FIG. 2 in an atmosphere comprising steam at a partial pressure of 0.5 atm, nitrogen and a very small amount of oxygen. The insulating layer of a thus-produced multilayer substrate (see FIG. 3) exhibited a performance similar to that of the sintered product produced in Example 1. The Cu conductor had a specific resistance value (i.e., a resistivity value) of 3μΩ·cm and was satisfactory as a low-resistance conductor.

EXAMPLE 8

Li$_2$CO$_3$ (2) was added in amounts of 1, 3 and 5% by weight to an amorphous silica powder (1) having an average particle size of 5 nm, and the resulting mixture (12) was subjected to a ball mill blending (3) using pure water (13) as a dispersing medium. This mixture solution was dried (4), thereby uniformly depositing Li$_2$CO$_3$ onto surfaces of the silica powder particles (13'). The resulting material was granulated to provide a starting powder (see FIG. 1a). The produced starting powder was added to a solution of polyvinyl butyral (6) dissolved in a solvent (5) consisting essentially of ethanol and then uniformly mixed to produce a slurry having a viscosity of 3,000 to 10,000 cps (7). Slurries were produced in the same manner, except that Li$_2$CO$_3$ was replaced by Na$_2$CO$_3$, K$_2$CO$_3$ and Rb$_2$CO$_3$. Each of these slurries was subjected to a slip casting process to form green sheets (14) each having a thickness of 50 to 200 μm (8). A plurality of the green sheets were subjected to a hot pressuring to provide a green laminate (9), (10). The laminate was fired at 800° C., 1,000° C. and 1,200° C. for 5 hours in an atmosphere containing steam at a partial pressure of 0.5 atm, nitrogen and oxygen (11).

Figure 1A:
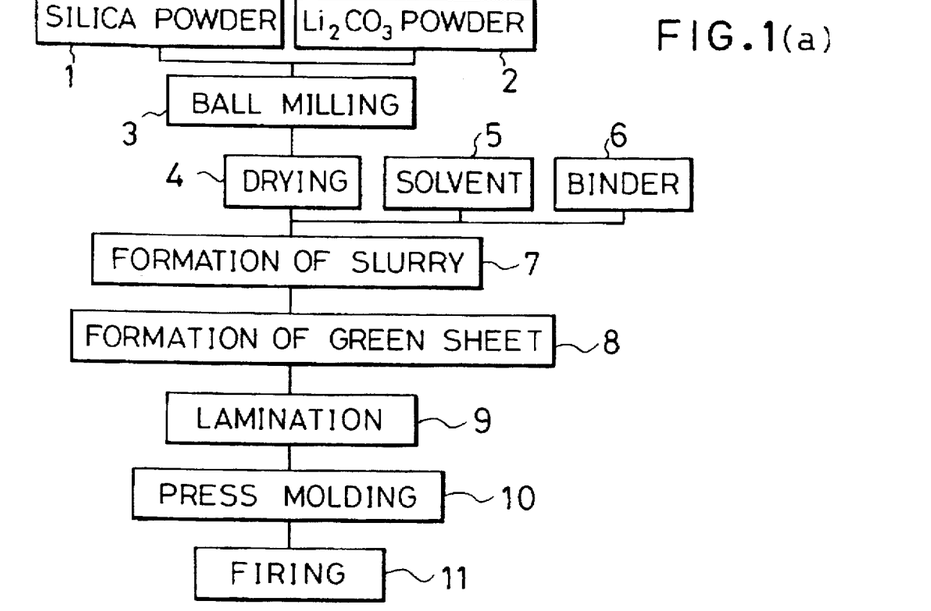
FIGS. 1a and 1b illustrate procedures for fabricating a sample according to one embodiment of the present invention.
Figure 1B:
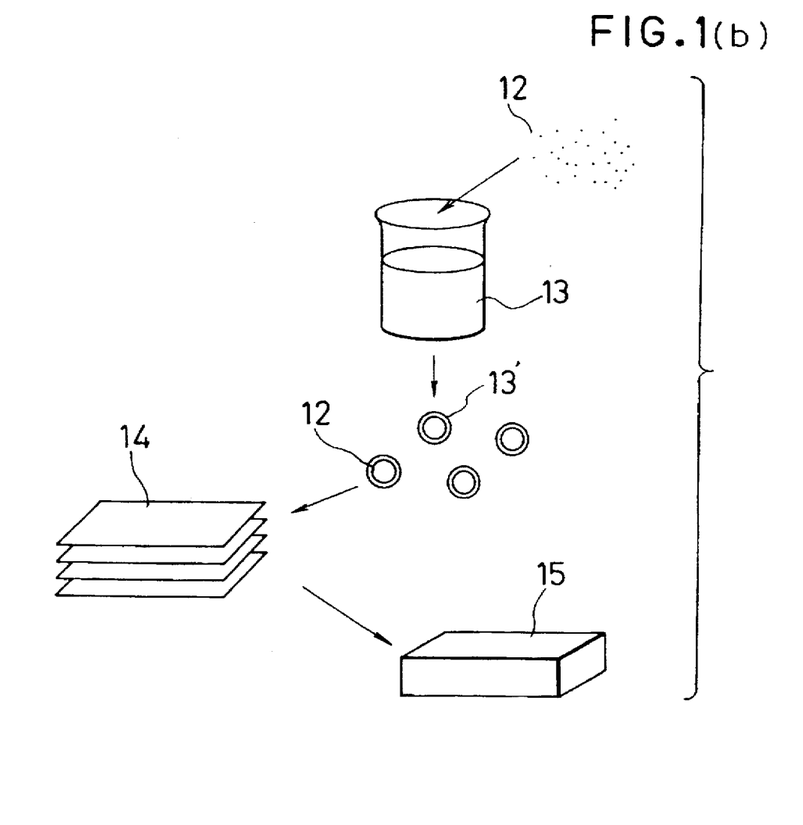

The sample of silica sintered product (15) made by adding Li$_2$CO$_3$ had a relative density of 96.0% or more and showed a sufficient sinterability (Table 4). Likewise, the samples made by adding Na$_2$CO$_3$, K$_2$CO$_3$ and Rb$_2$CO$_3$ showed a sufficient sinterability (Tables 2, 3 and 4).

In addition to the carbonates, the alkali metal compounds, which exhibit an addition effect and which may be used, include Li$_2$O, K$_2$O, Rb$_2$O and the like.

TABLE 4

Sinterability of SiO$_2$—Li$_2$CO$_3$

| Amount added | Relative density % at temperature of | | | |
|---|---|---|---|---|
| % by weight | 800° C. | 1,000° C. | 1,200° C. | Note |
| 1 | 96.0 | 97.5 | 98.2 | Example 8 |
| 3 | 97.1 | 98.5 | 99.0 | Example 8 |
| 5 | 98.3 | 100 | 100 | Example 8 |
| 10 | 99.0 | 100 | melt | Com. Ex. 6 |

Com. Ex. = Comparative example

TABLE 5

Sinterability of SiO$_2$—Na$_2$CO$_3$

| Amount added | Relative density % at temperature of | | | |
|---|---|---|---|---|
| % by weight | 800° C. | 1,000° C. | 1,200° C. | Note |
| 1 | 96.0 | 98.0 | 98.2 | Example 8 |
| 3 | 97.6 | 98.6 | 99.0 | Example 8 |
| 5 | 98.5 | 99.5 | 100 | Example 8 |
| 10 | 99.2 | 100 | melt | Com. Ex. 6 |

Com. Ex. = Comparative example

TABLE 6

Sinterability of SiO$_2$—K$_2$CO$_3$

| Amount added | Relative density % at temperature of | | | |
|---|---|---|---|---|
| % by weight | 800° C. | 1,000° C. | 1,200° C. | Note |
| 1 | 96.0 | 98.0 | 98.4 | Example 8 |
| 3 | 97.5 | 98.5 | 99.0 | Example 8 |
| 5 | 98.5 | 99.5 | 100 | Example 8 |
| 10 | 99.0 | 100 | melt | Com. Ex. 6 |

Com. Ex. = Comparative example

TABLE 7

Sinterability of SiO$_2$—Rb$_2$CO$_3$

| Amount added | Relative density % at temperature of | | | |
|---|---|---|---|---|
| % by weight | 800° C. | 1,000° C. | 1,200° C. | Note |
| 1 | 96.2 | 98.0 | 98.5 | Example 8 |
| 3 | 97.8 | 98.5 | 99.0 | Example 8 |
| 5 | 99.0 | 100 | 100 | Example 8 |
| 10 | 100 | 100 | melt | Com. Ex. 6 |

Com. Ex. = Comparative example

EXAMPLE 9

Magnesium oxide (MgO) was added in an amount of 1, 3 and 5% by weight to an amorphous silica powder having an average particle size of 5 nm, and the mixture was subjected to a ball mill blending using pure water was a dispersing medium. After blending, the mixture was dried to remove water, thereby uniformly depositing MgO onto surfaces of the silica powder particles. The powder mixture was granulated to provide a starting powder. The resulting powder was added to a solution of polyvinyl butyral in a solvent consisting essentially of ethanol and then uniformly mixed to produce a slurry having a viscosity of 3,000 to 10,000 cps. Slurries were also produced in the same manner, except that the magnesium oxide (MgO) was substituted by CaCO$_3$ and SrCO$_3$. Each of these slurries was subjected to a slip casting process to form a green sheet having a thickness of 50 to 200 µm. A plurality of the green sheets were subjected to a hot pressing to provide a green laminate. The green laminate was fired at 800°, 1,000° and 1,200° C. for 5 hours in an atmosphere containing steam at a partial pressure of 0.5 atm, nitrogen and oxygen.

It was observed that each of the resulting sintered products had a relative density of 96.0% or more and showed a sufficient sinterability (Tables 8, 9 and 10). It was also confirmed that the sample having a density near 100% had a higher light transmission property.

The alkaline earth metals which may be added include MgCO$_3$, CaO and SrO in addition to the above-described additives.

TABLE 8

Sinterability of SiO$_2$—MgO

| Amount added | Relative density % at temperature of | | | |
|---|---|---|---|---|
| % by weight | 800° C. | 1,000° C. | 1,200° C. | Note |
| 1 | 96.2 | 97.0 | 98.0 | Example 9 |
| 3 | 97.0 | 98.8 | 99.0 | Example 9 |
| 5 | 98.5 | 100 | 100 | Example 9 |
| 10 | 100 | 100 | 100 | Com. Ex. 7 |

Com. Ex. = Comparative example

TABLE 9

Sinterability of SiO$_2$—CaCO$_3$

| Amount added | Relative density % at temperature of | | | |
|---|---|---|---|---|
| % by weight | 800° C. | 1,000° C. | 1,200° C. | Note |
| 1 | 96.0 | 97.5 | 98.6 | Example 9 |
| 3 | 97.4 | 98.6 | 99.2 | Example 9 |
| 5 | 99.0 | 100 | 100 | Example 9 |
| 10 | 100 | 100 | 100 | Com. Ex. 7 |

Com. Ex. = Comparative example

TABLE 10

Sinterability of SiO$_2$—SrCO$_3$

| Amount added | Relative density % at temperature of | | | |
|---|---|---|---|---|
| % by weight | 800° C. | 1,000° C. | 1,200° C. | Note |
| 1 | 96.0 | 97.2 | 98.0 | Example 9 |
| 3 | 96.2 | 98.0 | 98.5 | Example 9 |
| 5 | 97.5 | 99.0 | 99.0 | Example 9 |
| 10 | 98.2 | 99.5 | 100 | Com. Ex. 7 |

Com. Ex. = Comparative example

EXAMPLE 10

Potassium carbonate (K$_2$CO$_3$) and calcium carbonate (Ca$_2$CO$_3$) were added respectively in amounts of 2% by weight to an amorphous silica powder as described in Examples 8 and 9, and a powder mixture having the additives uniformly deposited on surfaces of the silica powder particles was produced in the same manner as in Examples 1 and 2. A green sheet was formed from the produced powder mixture in the same manner as in Examples 1 and 2. A plurality of the green sheets were laminated one on another and subjected to provide a green laminate. The laminate was fired at 1,000° C. for 5 hours in an atmosphere containing steam at a partial pressure of 0.5 atm, nitrogen and oxygen.

Each of the resulting sintered product exhibited a light transmission property. As a result of the observation of a broken face by a scan-type electronic microscope, it was confirmed that the sintered product was a sufficiently dense sintered product (Table 11).

TABLE 11

Sinterability of $SiO_2$-additives

| Additives % by weight | Cal. tem. °C. | Time H | Partial pre. of steam (atm) | Note |
|---|---|---|---|---|
| $Li_2CO_3$ 2 wt % $CaCO_3$ 3 wt % | 1,000 | 5 | 0.5 | Sintered |
| $Na_2CO_3$ 2 wt % $CaCO_3$ 3 wt % | 1,000 | 5 | 0.5 | Sintered |
| $Ka_2CO_3$ 2 wt % $CaCO_3$ 3 wt % | 1,000 | 5 | 0.5 | Example 10 |
| $Rb_2CO_3$ 2 wt % $CaCO_3$ 3 wt % | 1,000 | 5 | 0.5 | Sintered |
| $Rb_2CO_3$ 4 wt % MgO 1 wt % | 1,200 | 5 | 0.7 | Sintered |
| $Rb_2CO_3$ 4 wt % $CaCO_3$ 1 wt % | 1,200 | 5 | 0.7 | Sintered |
| $Rb_2CO_3$ 4 wt % $SrCO_3$ 1 wt % | 1,200 | 5 | 0.7 | Sintered |

EXAMPLE 11

Boron oxide ($B_2O_3$) was added in an amount of 1, 3 and 5% by weight to an amorphous silica powder having an average particle size of 10 nm, and a slurry, a green sheet and a green laminate were sequentially produced in the same manner as in Example 8. The laminate was fired or calcined at 800°, 1,000° and 1,200° C. for 5 hours in an atmosphere containing steam at a partial pressure of 0.5 atm, nitrogen and oxygen.

Each of the resulting sintered products had a relative density of 96.0 ore more and showed a sufficient sinterability, the sintered product assumes an appearance with a light transmission property. As a result of the observation of a broken face, it was confirmed that the product was a dense sintered product.

TABLE 12

Sinterability of $SiO_2$—$B_2O_3$

| Amount added | Relative density % at temperature of | | | Note |
|---|---|---|---|---|
| % by weight | 800° C. | 1,000° C. | 1,200° C. | |
| 1 | 96.0 | 97.0 | 98.5 | Example 11 |
| 3 | 97.8 | 98.6 | 100 | Example 11 |
| 5 | 98.5 | 100 | 100 | Example 11 |
| 10 | 100 | melt | melt | Com. Ex. 7 |

Com. Ex. = Comparative example

EXAMPLE 12

A coarse powder of amorphous silica having an average particle size of about 10 µm was pulverized using a dry pulverizer. The average particle size of the resulting powder was measured, and the result showed 0.5 µm. Boron oxide ($B_2O_3$) was added in an amount of 1, 3 and 5% by weight to the amorphous silica powder, and a laminate was produced in the same manner as in Example 4. The laminate was fired or calcined at 1,200° C. for 10 hours in an atmosphere containing steam at a partial pressure of 0.85 atm, oxygen and nitrogen.

The resulting sample had a sintered product density of 96.0% and a sufficiently high strength. It was confirmed that the sufficient sintering was completed at 1,200° C. by using the amorphous silica powder having an average particle size of 0.5 µm as a starting powder.

EXAMPLE 13

A laminate was produced in the same manner as in Example 8 from a powder mixture comprising an amorphous silica powder having an average particle size of 5 nm and boron oxide ($B_2O_3$) added thereto in an amount of 5% by weight. The laminate was fired at 1,200° C. for 1, 5, 10 and 20 hours in an atmosphere containing steam at a partial pressure of 0.005 atm, nitrogen and oxygen.

When the firing time was one hour, the advancement of sintering was insufficient and hence, the produced sample had an insufficient strength. As the firing time was prolonged to 5 and 10 hours, an increase in density of the ample was observed. When the firing time reached 20 hours, the resulting sample had a relative density of 96% or more. As a result of the observation of a broken face by an scan-type electronic microscope, it was confirmed that a sufficient sintering was advanced. This indicates that the amorphous silica powder can be sintered at 1,200° C. by using the firing atmosphere containing steam at a partial pressure of 0.05 atm.

EXAMPLE 14

Figure 3:
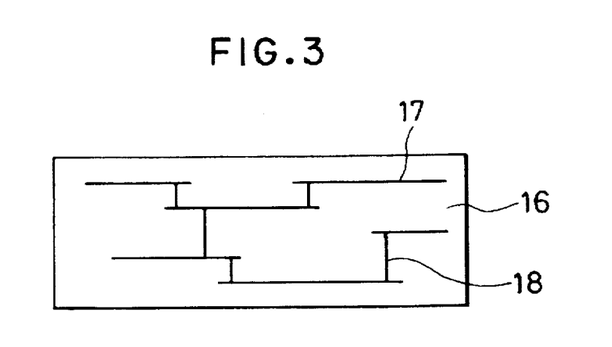
FIG. 3 is a diagrammatic illustration of the construction of a multi-layer wiring substrate made using Cu as a low resistance conductor according to another embodiment of the present invention.

A green sheet comprising 97% by weight of $SiO_2$ and 3% by weight of MgO and having a thickness of 100 µm was fabricated in the same manner as in Example 9. The $SiO_2$ powder used was an amorphous silica powder having an average particle size of 5 nm. Via holes having a diameter of 180 µm were made in the green sheet, and a copper paste was embedded in the via holes. A conductor pattern (17), (18) was printed. Twenty green sheets produced through these processing steps were placed one on another and heated to 110° C. and subjected to a pressing under a pressure of 20 MPa to fabricate a green laminate. The green laminate was fired at 1,000° C. for 5 hours in an atmosphere containing steam at a partial pressure of 0.5 atm, nitrogen and oxygen.

The insulating layer of a multi-layer wiring substrate produced in this manner assumed a nature similar to that of the sintered product produced in Example 2. The measurement of a dielectric constant showed 5.0 at 10 GHz, and the dielectric loss tangent (tan δ) was $7 \times 10^{-4}$. The Cu conductor had a specific resistance value of 3µΩ·cm and was satisfactory as a low-resistance conductor.

EXAMPLE 15

In this example, as the materials, there were used mixed powder consisting of (a) 80 volume % of amorphous quartz powder having a mean particle diameter of 5 nm and 20 volume % of α-quartz powder having a mean particle diameter of 1 µm and (b) mixed powder consisting of 99 volume % of amorphous quartz powder having a mean particle diameter of 5 nm and 1 volume % of α-quartz having a mean particle diameter of 10 µm. This mixture was mixed in a bowl mill by use of ethyl cellosolve as a dispersion medium. Polyvinyl butyral, a plasticizing material and the like are added to the thus obtained fluid dispersions, and subsequently, the fluid dispersion was heated to 80° C. by a homogenizer, while a binder was melted and mixed therewith, whereby slurry having the viscosity of 3,000–10,000 cps was produced. The thus obtained slurry was turned into a green sheet having a thickness of 50–200 µm by a slip casting process for producing a film. By heat-pressing the green sheet thus obtained, a raw laminated material was obtained. This raw laminated material was sintered under an atmosphere of partial pressure of steam having 0.5 atmospheric pressure and containing oxygen and nitrogen for 10 hours at 1,000° C.

Figure 5:
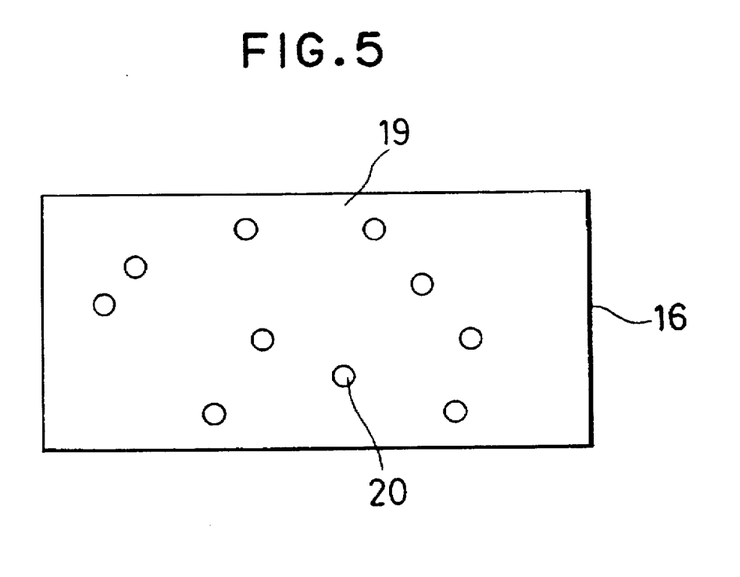
FIG. 5 illustrates a schematic structure of a silica sintered product according to another embodiment of the present invention.

The thus obtained sintered material of silica (16) was translucent and white and had a density of 2.40 g/cm³. When the rupture cross-section thereof was observed by a scanning electron microscope, pores were hardly recognized and the silica was observed to be a dense sintered material. Furthermore, when fracture toughness tests were performed on this sintered material, the result was that KIc equals to 3.5 MPa/m$^{1/2}$ and 3.0 MPa, so that it was ascertained that the satisfactory reliability was achieved.

When, as the material, α-quartz was replaced by cristobarite or tridymite, in either case, the fracture toughness is more than 3.0 MPa/m$^{1/2}$ and the satisfactory reliability was obtained in either case.

EXAMPLE 16

The case powder of the amorphous quartz was crushed by a dry type crusher to obtain dust-size particles. When the particle diameter of the powder was measured by a laser diffraction granulometer, the mean particle diameter was 500 nm. As the material powders, there were used mixed powder consisting of 80 volume % of the above-described dust-size particles and 20 volume % of α-quartz powder having a mean particle diameter of 1 μm and mixed powder of 99 volume % of the above-described dust-size particles and 1 volume % of α-quartz powder having a mean particle diameter of 10 μm, whereby a raw laminated material was produced by the process similar to Example 1. This raw laminated material was sintered under an atmosphere of partial pressure of steam having 0.5 atmospheric pressure and containing oxygen and nitrogen for 50 hours at 1,200° C.

When the fracture toughness value of the thus obtained sintered material of silica was measured, the result was (16) that KIc equals to 3.5 MPa/m$^{1/2}$ and 3.0 MPa. The sintered material of silica (16) contains fine particles of crystallized quartz (20) in quartz matrix (19).

EXAMPLE 17

Each of a powder mixture comprising 95.0% by weight of an amorphous silica powder having an average particle size of 7 nm, 1.0% by weight of Rb$_2$CO$_3$, and 4.0% by weight of B$_2$O$_3$ and a powder mixture comprising 95.5% by weight of an amorphous silica powder having an average particle size of 7 nm, 0.5% by weight of K$_2$CO$_3$ and 4.0% by weight of B$_2$O$_3$ was blended by a ball mill using pure water as a dispersing medium. The resulting powder mixtures were dried and then granulated to provide two starting powders. Each of the starting powders and polyvinyl butyral were added to a solvent consisting essentially of ethanol and mixed uniformly to produce a slurry having a viscosity of 3,000 to 10,000 cps. The slurry was subjected to a slip casting process to form a green sheet having a thickness of 50 to 200 μm. A plurality of the green sheet were subjected to a hot pressing to provide a green laminate. Each of the two thus-produced green laminates was fired at 950° C. for 5 hours in an atmosphere containing steam at a partial pressure of 0.5 atm, nitrogen and oxygen.

Any of the resulting sintered products had a relative density of 98.0% or more, and it can be seen that the sintering can be achieved at a lower firing temperature, as compared with the product made by adding B$_2$O$_3$ alone.

COMPARATIVE EXAMPLE 1

A sample fabricated through steps similar to those in Example 1 was fired at 750° C. for 48 hours in an atmosphere containing steam at 0.85 atm, oxygen and nitrogen in an electric furnace (sample No. 13 in Table 2). The resulting sample exhibited a large shrinkage, as compared with the dimensions of the green laminate, but assumed a white color with no light transmission property observed. As a result of the observation of a broken face by a scan-type electronic microscope, it was observed that the sample was unsintered. Therefore, it is believed that the firing temperature of 750° C. is insufficient.

On the other hand, if the firing is carried out at a temperature in a range of at least 1,200° C., a satisfactory sintering can be achieved. However, such a temperature is equal to or higher than the melting point of the low-resistance conductor and hence, cannot be put to practical use.

COMPARATIVE EXAMPLE 2

A green laminate fabricated through steps similar to those in Example 1 was fired or calcined at a highest temperature of 1,200° C. for 48 hours in an atmosphere containing steam at a partial pressure of 0.04 atm, nitrogen and oxygen (sample No. 9 in Table 2). The resulting sample did not exhibited a light transmission property and was not sintered at all. If steam occupying the calcining atmosphere is in an amount corresponding to 0.004 atm or less in the terms of a partial pressure, a sufficiently sintered product is not produced by the firing at a temperature in a range defined according to the present invention.

A partial pressure of 0.85 atm or more for the amount of steam is difficult to realize and hence, cannot be put to practical use.

COMPARATIVE EXAMPLE 3

Using 45% by weight of an amorphous silica powder having an average particle size of 5 nm and 55% by weight of a crystalline quartz powder having an average particle size of 1 μm as starting materials, a green laminate was produced in the same manner as in Example 4. This laminate was fired at 1,200° C. for 24 hours in an atmosphere containing steam at a partial pressure of 0.5 atm, oxygen and nitrogen (sample No. 15 in Table 3). The thus-produced sample exhibited a large shrinkage, as compared with the dimensions of the green laminate, but exhibited a brittleness such that the sample can be easily broken. This shows an insufficient sintering. Thus, if the amount of the amorphous silica is smaller than 45% by weight, a sufficiently sintered product cannot be produced under firing conditions fallen into the scope of the present invention.

COMPARATIVE EXAMPLE 4

A coarse powder of crystalline silica was finely pulverized by a dry pulverizer to provide a fine power having an average particle size of 0.5 μm. This fine powder was subjected to an identification of the crystal phase by an X-ray diffraction process. This showed a result that the entire power was crystalline quartz. Using this powder as a starting powder, a green laminate was fabricated through steps similar to those in Example 1. The green laminate was fired at 1,200° C. for 24 hours in an atmosphere containing steam at a partial pressure of 0.5 atm, oxygen and nitrogen (sample No. 14 in Table 3). The thus-obtained silica sintered product assumed a white color and was very brittle. As a result of the observation of a broken face by a scan-type electronic microscope, it was confirmed that there were a large number of microcracks produced. This is believed to be because a transition point from a high-temperature crystal to a low-temperature crystal existed in the middle of a cooling step. Therefore, the use of only the crystalline quartz as the starting powder is unsuitable for producing a sample having a high strength.

COMPARATIVE EXAMPLE 5

Using a powder mixture of 90% by weight of an amorphous silica powder having an average particle size of 7 nm and 10% by weight of a borosilicate glass powder having an average particle size of 1 μm, a green laminate was fabricated through steps similar to those in Example 4, and fired at 1,000° C. for 24 hours in an atmosphere comprising steam at a partial pressure of 0.5 atm, nitrogen and oxygen. The resulting sample had an appearance similar to that of the sample produced in Example 6. However, the measurement of the dielectric constant showed a value of 4.1 at 1 MHz, which is larger than 4.0. When a dense silica sintered product having a $SiO_2$ content less than 95% by weight was made, an advantage of a low dielectric constant is lost and hence, such dense silica sintered product cannot be put to practical use.

COMPARATIVE EXAMPLE 6

Each of $Li_2CO_3$, $Na_2CO_3$, $K_2CO_3$ and $Rb_2CO_3$ were added as an additive in an amount of 10% by weight to an amorphous silica powder having an average particle size of 5 nm in the same manner as in Example 1 to prepare starting powders. Using each of the starting powders, a green laminate was fabricated in the same manner as in Example 1. Using, as a starting powder, an amorphous silica powder having an average particle size of 5 nm with no additive added thereto, a green laminate was also fabricated in the same manner. These five samples were fired at 800°, 1,000° and 1,200° C. for 5 hours in an atmosphere containing steam at a partial pressure of 0.5 atm, nitrogen and oxygen (Tables 1, 2, 3 and 4).

With the samples produced from the starting powders containing $Li_2CO_3$, $Na_2CO_3$, $K_2CO_3$ and $Rb_2CO_3$ added, a sufficient sintering was observed at each of the firing temperatures. However, the measurement of a specific dielectric constant of each of the samples at 1 MHz showed 4.0 or more. From the viewpoint of a dielectric characteristic, the amount of additive added equal to or greater than 5% by weight is unsuitable. It was confirmed that the sample produced from the silica powder alone was sufficiently not sintered and had a relative density of 92.0%. From the fact that the sample produced from the starting powder containing each additive added in an amount of 1% by weight or more had a relative density of 96.0% or more in Example, it can be seen that the addition of any of the alkali metals in an amount of 1% by weight or more enables the sinterability to be enhanced.

COMPARATIVE EXAMPLE 7

Each of MgO, $CaCO_3$ and $SrCO_3$ was added in an amount of 10% by weight to an amorphous silica powder having an average particle size of 5 nm in the same manner as in Example 2 to prepare starting powders. Using each of the starting powders, a green laminate was fabricated in the same manner as in Example 2. The three samples were fired at 800°, 1,000° and 1,200° C. for 5 hours in atmosphere containing steam at a partial pressure of 0.5 atm, nitrogen and oxygen (Tables 5, 6 and 7)

Each of the samples had a relative density of 98.0% or more, and in each of the samples, a sufficiently sintering was observed. However, the measurement of a specific dielectric constant of each of the samples at 1 MHz showed 4.0 or more. From the viewpoint of a dielectric characteristic, the amount of additive added equal to or more than 5% by weight is unsuitable.

Boron oxide ($B_2O_3$) was added in an amount of 10% by weight to an amorphous silica powder having an average particle size of 10 nm in the same manner as in Example 11 to prepare a starting powder. Using this starting powder, a green laminate was fabricated through steps similar to those in Example 11. The laminate was fired at 800°, 1,000° and 1,200° C. for 5 hours in an atmosphere containing steam at a partial pressure of 0.5 atm, nitrogen and oxygen (Table 12).

When the firing temperature was 800° C., it was confirmed from a relative density that the product was sufficiently sintered. However, the product had a specific dielectric constant of 4.5 (at 1 MHz) and hence, from the view points of a dielectric characteristic, the amount of additive added equal to 10% by weight is unsuitable. When the firing temperature was 1,000° C. or more, it was observed that the green laminate was molten. It is judged from the foregoing that the amount of B2O3 added is suitable to be 5% by weight or less.

What is claimed is:

1. A process for producing a silica sintered product for a multi-layer wiring substrate, comprising the steps of:
    providing a fine silica powder having an average particle size of 5 to 500 nm and a fine crystallized quartz powder having an average particle size 1 to 10 μm, said fine crystallized quartz powder having a volume equal to 1 to 20% of the entire volume of said fine silica powder and said fine crystallized quartz powder;
    mixing said fine silica powder and said fine crystallized quartz powder with a binder and a solvent to form a silica-containing slurry;
    forming a green sheet by slip-casting said silica-containing slurry; and
    firing said green sheet at a temperature of 800° to 1200° C. in an atmosphere containing steam at a partial pressure of 0.005 to 0.85 atm.

2. A process for producing a silica sintered product for a multi-layer wiring substrate according to claim 1, wherein said fine silica powder has a specific surface area in a range of 5 $m^2/g$ (inclusive) to 450 $m^2/g$ (inclusive).

3. A process for producing a silica sintered product for a multi-layer wiring substrate according to claim 1, wherein said fine crystallized quartz powder is one or more from among α-quartz, cristobalite and tridymite.

4. A process for producing a silica sintered product for a multi-layer wiring substrate according to claim 1, wherein 50% by weight or more of said silica sintered product is an amorphous silica.

\* \* \* \* \*